United States Patent [19]

Kusiak, Jr.

[11] Patent Number: 4,987,391
[45] Date of Patent: Jan. 22, 1991

[54] ANTENNA CABLE GROUND ISOLATOR

[76] Inventor: Michael Kusiak, Jr., 45 Cypress St., Yonkers, N.Y. 10704

[21] Appl. No.: 493,446

[22] Filed: Mar. 14, 1990

[51] Int. Cl.$^5$ .............................................. H01P 1/20
[52] U.S. Cl. ................................... 333/12; 333/24 C; 333/206; 361/111
[58] Field of Search ............... 333/12, 24 C, 248, 206; 343/847; 361/107, 111, 120; 439/620; 174/38 R

[56] References Cited

U.S. PATENT DOCUMENTS

| | | | |
|---|---|---|---|
| 3,393,384 | 7/1968 | Bailey et al. | 333/206 |
| 3,617,607 | 11/1971 | Williams | 333/245 X |
| 3,908,176 | 9/1975 | De Boer | 333/24 C |
| 4,267,529 | 5/1981 | Brun et al. | 333/12 |
| 4,370,630 | 1/1983 | Capek et al. | 333/24 C |
| 4,399,419 | 8/1983 | Bolbrovolny | 333/206 |
| 4,559,506 | 12/1985 | Capek | 333/181 |

OTHER PUBLICATIONS

Mecl System Design Handbook, Motorola Inc. 1983, Chapter 3, pp. 44–46.

Primary Examiner—Paul Gensler

[57] ABSTRACT

A coaxial cable isolator is presented which serves to reduce or eliminate ground loop induced hum and interference in audio-video entertainment systems connected to externally grounded antenna signal sources. A linearly arranged array of discrete monolithic capacitive elements couples two ground plane areas fabricated on a circuit board, which are connected respectively to the shield conductors of the input and output coaxial cables between which DC and audio frequency isolation is desired. Resistive elements are provided for the dissipation of accumulated static charges, and a gas discharge transient suppressor protects equipment connected to the isolator's output from voltages induced by nearby lightning strikes.

14 Claims, 2 Drawing Sheets

4,987,391

ANTENNA CABLE GROUND ISOLATOR

BACKGROUND OF THE INVENTION

This invention relates generally to coaxial cable isolators, and specifically to an antenna coaxial cable ground isolator for use in audio-video entertainment systems.

When a cable TV or other externally grounded coaxial antenna cable is connected to an extensive audio-video entertainment system, it is common to encounter problems caused by circulating ground currents. These currents are due to the difference in line frequency AC potential between the system audio ground reference provided by the AC wall outlet and the ground provided by the coaxial antenna cable. The resulting ground loop current, flowing through the system wiring, produces hum and noise voltages which are amplified and reproduced by the system's speakers. In severe cases, the signal may be visible on a television monitor as a slowly rising horizontal line.

Heretofore, audio-video system installers have attempted to alleviate this problem by several methods. The most common of these has been to isolate the system equipment from the ac supply ground by means of "3 prong to 2 prong" wall socket adapters. This practice, although sometimes effective, presents a serious shock hazard and is contrary to safety and electrical codes.

Another technique has been to connect the cable antenna line through "back to back" 75 ohm to 300 ohm "balun" (balanced to unbalanced) transformers incorporating DC isolation. Although successful in breaking the ground loop, this method typically causes signal degradation due to losses and stray signal pickup.

Unfortunately, the optimum solution to the problem, use of a coaxial cable capacitive isolator for providing an interruption in the DC and low frequency continuity of a cable is not widespread in the audio-video installation field, due mainly to the lack of commercially viable products.

The theory and application of capacitive isolators is well documented by several prior art references. U.S. Pat. No. 3,393,384 to Bailey et al. provides a basis for such a coaxial isolator. U.S. Pat. No. 3,908,176 to De Boer carries its development further, describing an isolator specifically designed for cable TV antenna systems. It must be noted, however, that both these and subsequent references relate to isolators constructed coaxially with cylindrical capacitive elements. Although providing excellent high frequency coupling and minimum VSWR (voltage standing wave ratio), this physical configuration is both difficult and costly to manufacture. The capacitors necessary for such an isolator are not standard commercially available components and must be specifically designed and fablricated for the application.

Heretofore, the inexpensive alternative to the coaxial isolator described above has been to connect discrete wire leaded capacitors in series with both the shield and inner conductors of the coaxial cable requiring isolation. This approach presents serious problems, however, in that the lead inductance and equivalent series resistance of the discrete components tend to reduce performance, especially at UHF frequencies. Specifically, cables employing such isolation techniques are subject to interference from external electromagnetic fields. Such interactions are due to the parasitic impendance placed in series with the coaxial shield, allowing interfering signal voltages induced on the shield conductor to couple with those of the desired signal internal to the cable. In addition, the discontinuity resulting from the interruption in the transmission line evironment produces reflections, a high VSWR, and additional signal loss.

The principal object of the present invention is to permit manufacture by modern automated electronic assembly techniques, a cost-effective isolator capable of the radio frequency performance of the cylindrical capacitor variety.

Another object of the invention is to provide for the dissipation of accumulated static charges on the coaxial line.

Still another object of the invention is to provide protection for associated electronic equipment connected to the output of the device from high voltage transients which may be produced by nearby lightning strikes.

Further objects and advantages of the invention will become apparent from a consideration of the ensuing drawings and detailed description.

SUMMARY OF THE INVENTION

The present invention utilizes a novel capacitor array, composed of a plurality of discrete, inexpensive, readily available monolithic ceramic capacitors, for isolating the shield conductor of a coaxial cable. This array couples two ground plane areas of conductive material on a circuit board, connected respectively to the input and output shield conductors. In a preferred embodiment of the invention, the inner coaxial conductors are connected to a microstrip transmission line fabricated on the same circuit board, which also incorporates capacitive isolation. This method of construction allows assembly by modern automated surface mount technology equipment at low cost, yet provides performance comparable in all respects to a true coaxially constructed isolator.

Resistors are connected across the input and output terminals to their respective grounds, as well as across the isolating capacitor array. These resistors provide a circuit path for the dissipation of accumulated static charges which otherwise might build up on the cables or capacitors internal to the isolator. A gas discharge transient suppressor is also connected across the input coaxial terminals to safely absorb high voltage transients which otherwise might damage the isolator or equipment connected to it.

DETAILED DESCRIPTION OF THE INVENTION

Figure 1:
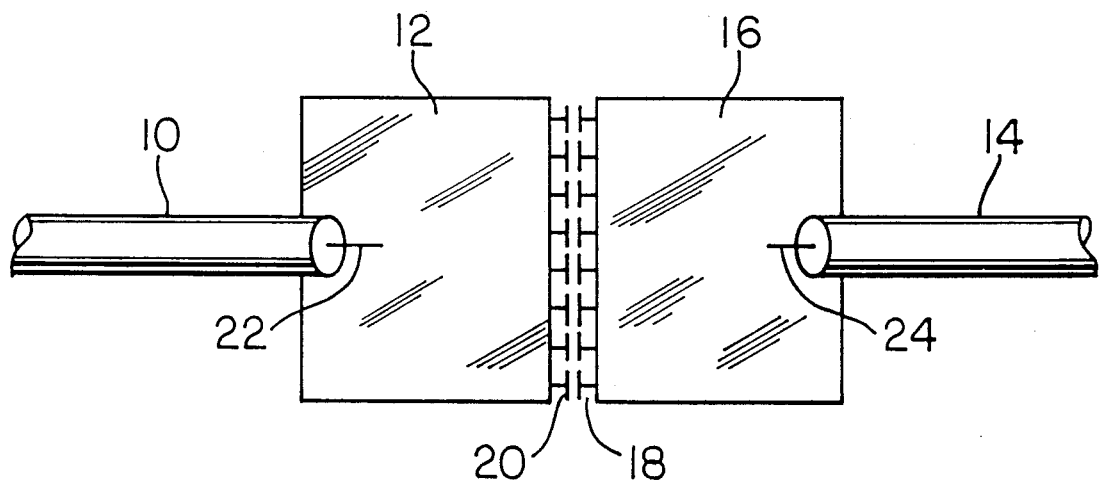
FIG. 1 is a simplified schematic representation of the invention, showing the arrangement used to isolate the coaxial shield conductors.

A simplified schematic representation of the present invention is illustrated by FIG. 1. The input coaxial cable shield conductor 10 is electrically connected to an area of conductive ground plane 12. Likewise, output coaxial cable shield conductor 14 is connected to a similar ground plane 16. Separating the respective input and output ground planes 12 and 16 is a nonconducting gap 18. This physical separation serves to isolate the input and output ground planes from each other. Consequently, the input and output shield conductors 10 and 14 connected respectively to ground planes 12 and 16 are similarly isolated. Electrically connected across gap 18 is a plurality of discrete capacitive elements 20, placed one immediately adjacent to another, thereby constituting an essentially continuous capacitive coupling. It is intended that substantially the entire length of gap 18 be bridged by an array of capacitive elements 20, the number of elements dependent on the length of the gap and the physical width of each element.

The arrangment described above presents an essentially uninterrupted ground plane coupling the input and output coaxial shield conductors 10 and 14 for radio frequencies extending into the UHF and microwave region, while providing DC and low frequency isolation.

The input coaxial cable inner conductor 22, and the output coaxial inner conductor 24 are also coupled together. This coupling, not shown in FIG. 1 may be accomplished by a variety of means, ranging from a simple direct wired connection to a constant impedance transmission line employing capacitive isolation. An optimum arrangement for coupling the inner coaxial conductors will be discussed in the description of the preferred embodiment to follow.

The capacitance of each capacitive element 20 is chosen so that two competing criteria are met. Specifically, the sum total capacitance value of the plurality of elements comprising the array must be sufficiently large to couple the lowest desired radio frequency signal across the gap, yet small enough to present a barrier to audio and lower frequency signals. Expressed differently, the capacitive reactance of the array must approach zero for desired RF frequencies, yet approach infinity for audio and lower frequencies.

For the purposes of the present invention, namely the isolation of antenna coaxial cables used in audio-video entertainment systems, the frequency range of interest is 5 to 1000 MHz and possibly higher for satellite TV signals. The low frequency limit of 5 MHz is of most importance since it will define the isolator's cutoff frequency. In order to provide integrity of the shield conductor of the coaxial cable, the effective series impedance between the input and output shield terminals of the isolator should be as low as possible. For purposes of illustration, a maximum impedance of 1 ohm at 5 MHz is chosen, being small compared to the 75 ohm characteristic impedance normally employed for cables in the present application. To meet this requirement, the minimum required capacitance is calculated to be approximately 0.03 microfarad, this being the capacitance value exhibiting a reactance of 1 ohm at 5 MHz. This value also presents a reasonable compromise for meeting the low frequency isolation requirement. At 60 Hz, the US standard power line frequency, the capacitive reactance of 0.03 microfarad equals approximately 88,000 ohms. Since the typical impedance of a ground loop normally encountered is on the order of a few ohms or less, the low frequency isolation requirement has also been satisfied.

The above discussion of capacitor value selection has been given for purposes of illustration only. The actual value of total array capacitance will depend on the actual requirements of the specific application of the isolator.

Figure 2:
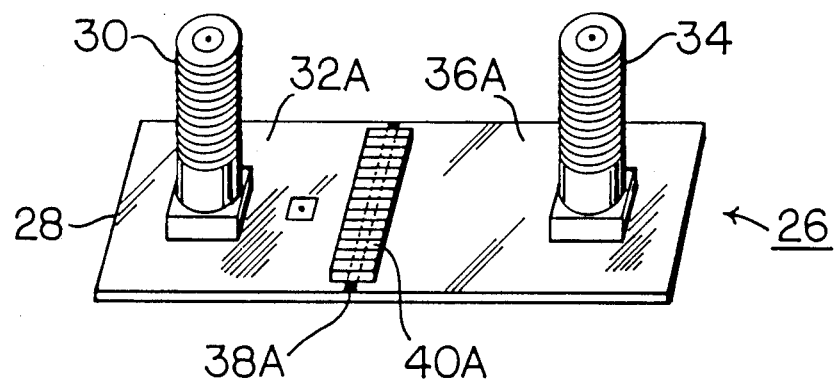
FIG. 2 illustrates a top perspective view of a preferred embodiment of the invention constructed with circuit board techniques.

FIG. 2 shows a top view of a preferred embodiment of the invention, constructed with circuit board assembly techniques. The shield terminals of input coaxial cable connector 30 are soldered to conductive input ground plane area 32A on a double sided, copper clad circuit board 28. Similarly, the shield terminals of output coaxial cable connector 34 are soldered to output ground plane area 36A. Input and output ground plane areas 32A and 36A are separated from each other by a linear gap 38A approximately 1 mm. (0.039 in.) wide. Across gap 38A are soldered approximately fifteen monolithic ceramic "chip" capacitors 40A. The capacitors are placed as closely adjacent to one another as physically possible by automated machinery. Monolithic ceramic capacitors were chosen for this application by virtue of their excellent physical and RF characteristics. Specifically, their rectangular configuration allows them to be arranged on the circuit board as a linear array, and their leadless construction minimizes series inductance and self-resonance effects. In combination, these features allow the fabrication of a capacitive array exhibiting almost ideal RF coupling characteristics.

Figure 3:
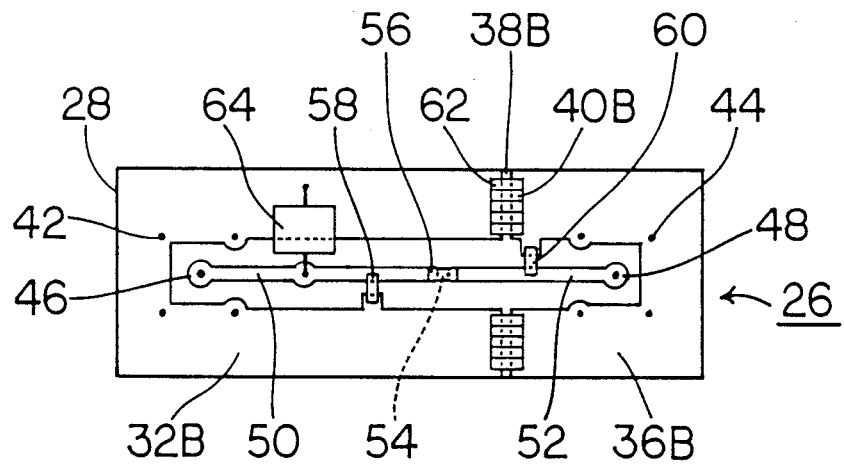
FIG. 3 illustrates a bottom view of the preferred embodiment shown in FIG. 2.

FIG. 3 shows the bottom view of the invention, which also corresponds to the opposite planar surface of circuit board 28 shown in FIG. 2. Input connector 30, by means of its mounting pins 42, connects upper ground plane 32A and lower ground plane 32B. Similarly, by means of pins 44, output connector 34 connects output ground planes 36A and 36B. Bottom ground planes 32B and 36B are also separated by a gap 38B, and are coupled by a plurality of capacitors 40B. In effect, top ground plane 32A and bottom ground plane 32B are in parallel, and top ground plane 36A and bottom ground plane 36B are in parallel, thereby servine to reduce the RF impedance between the input and output coaxial shield terminals of the isolator even further.

The input inner conductor terminal 46 of connector 30 is soldered to input strip conductor 50. Likewise, output inner conductor terminal 48 of connector 34 is soldered to output strip conductor 52. A strip conductor separated from a ground plane by a dielectric is termed a microstrip line. It is apparent from FIG. 3 that conductors 50 and 52 fit this description. Such a microstrip conductor represents a transmission line of characteristic impedance dependent upon the line's physical width, and the thickness and relative dielectric constant of the circuit board insulating material. To match the 75 ohm transmission line impedance specified earlier, a microstrip line width of approximately 1.3 mm. (0.050 in.) is required, using standard 1.6 mm. (0.062 in.) thick glass-epoxy circuit board material.

Microstrip conductors 50 and 52 are separated by a narrow gap 54. Across gap 54 is soldered a single monolithic ceramic capacitor 56, thereby coupling conductors 50 and 52, and consequently, the inner conductors of the input and output coaxial cables connected to the isolator. The value of coupling capacitor 56 is chosen by a method similar to that described earlier for the shield conductor capacitor array. Assuming a 3 dB low frequency cutoff of 5 MHz in a 75 ohm system, a minimum capacitance value of 420 picofarads is required.

Since gap 54 is narrow and capacitor 56 is approximately the same width as the microstrip conductors, very little discontinuity and mismatch occurs at this component termination, even up into the microwave frequency range. By the use of a microstrip transmission line coupling between the input and output inner coaxial conductor terminals, a constant impedance transmission line evironment is maintained through the isolator, thereby minimizing VSWR and reflection losses.

In order to dissipate static charges which may accumulate on the isolated coaxial cables, resistors 58, 60 and 62 are employed. Effectively, resistor 58 is connected across the coaxial input inner and shield conductors, resistor 60 is connected across the coaxial output inner and shield conductors, and resistor 62 is placed between the input and output shield conductors of the coaxial cable being isolated. These three resistors serve to provide a high impedance circuit path to bleed off any accumulation of static charge on the cables themselves or any of the coupling capacitors internal to the isolator. The value of these resistors is chosen to minimize circuit loading yet provide the desired charge dissipating effect. A resistance value of about 500,000 ohms satisfies both of these requirements.

A gas discharge transient suppressor 64 is connected between input microstrip 50 and input ground plane 32B and thereby across the inner and shield conductors of the coaxial cable being isolated. Any voltage transient exceeding 90 volts is clamped by means of suppressor 64, thereby protecting the isolator's other internal components and the receiving equipment connected to the isolator's output.

Figure 4:
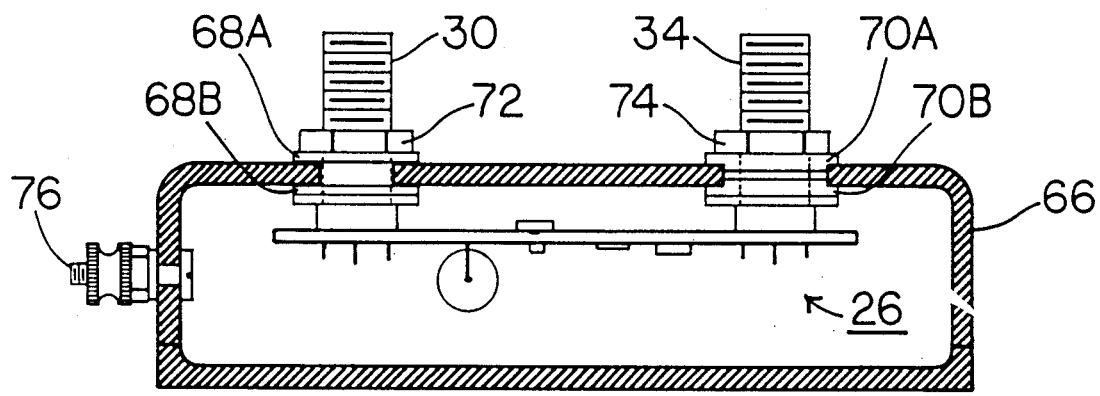
FIG. 4 shows a sectional view of a most preferred embodiment of the invention in which the isolator is contained inside a conductive enclosure.

FIG. 4 shows a most preferred embodiment of the invention in which the isolator 26 is surrounded by a conductive enclosure 66. Input and output connectors 30 and 34 extend through holes drilled in the enclosure. Input connector 30 is placed in electrical contact with enclosure 66 by means of conductive washers 68A and 68B, and is fastened by nut 72. Output connector 34 is similarly fastened by nut 74, however connector 34 is electrically isolated from enclosure 66 by insulating shoulder washers 70A and 70B. Terminal 76 allows connection of an external ground wire to the enclosure, thereby grounding input connector 30 and the shield of the coaxial cable attached to it. Such an external ground connection allows additional protection from induced transient voltages caused by lightning strikes. Conductive enclosure 66 serves to provide electrical shielding for isolator 26, reducing stray RF pickup.

From the above description it is evident that the invention meets its objective of providing the performance capabilities and transmission line characteristics of a true coaxially constructed isolator, while maintaining the cost effectiveness and ease of manufacture of circuit board construction utilizing discrete components. In addition, the invention in its preferred embodiment meets its objectives of dissipating static charges on the coaxial lines which it isolates, and of providing high voltage transient protection for equipment connected to its output.

The foregoing disclosure of the preferred embodiments of the invention has been presented for the purposes of illustration and description. It is not intended to be exhaustive or to limit the invention to the precise form disclosed. Many modifications and variations are possible in the light of the above teaching. For example, the isolator may also be constructed on a circuit board having conductive material on only one side, with the coaxial inner conductors coupled with a simple length of wire, a metallic strip, or an ordinary wire leaded capacitor, placed in close physical proximity to the ground plane so as to exhibit some defined transmission line characteristics. It is therefore intended that the scope of the invention be limited not by this detailed description, but rather by the appended claims and their legal equivalents.

What is claimed is:

1. A coaxial cable isolator comprising:
    an area of conductive input ground plane electrically connected to the shield conductor of an input coaxial cable to said isolator;
    an area of conductive output ground plane electrically connected to the shield conductor of an output coaxial cable to said isolator;
    said input and output ground planes being separated and thereby electrically isolated from each other by a nonconducting gap;
    a plurality of capacitive elements placed adjacent to one another in a substantially continuous fashion, bridging said gap over a considerable portion of its extent, thereby constituting a capacitive coupling across said gap; and
    a coupling means electrically connected between the respective inner conductors of said input and output coaxial cables to said isolator.

2. The coaxial cable isolator of claim 1 wherein said coupling means between said input coaxial inner conductors comprises a capacitor providing direct current and audio frequency isolation.

3. The coaxial cable isolator of claim 1 further comprising means for the dissipation of static charges accumulated on said input and output coaxial cables and internal capacitive elements of said isolator.

4. The coaxial cable isolator of claim 1 further comprising means for high voltage transient suppression, for the protection of equipment connected to said output coaxial cable.

5. The coaxial cable isolator of claim 1 further comprising a conductive enclosure electrically connected to one of said input or output coaxial shield conductors and electrically isolated from the other.

6. A coaxial cable isolator comprising:
    a circuit board clad with conductive material arranged in such a manner whereby the input and output coaxial shield conductors of a coaxial cable are electrically connected to respective conducting ground plane areas on said board which are separated by a continuous gap in said conductive material, so as to provide electrical isolation between said input and output shield conductors;
    a plurality of capacitive elements, placed adjacent to one another in a substantially continuous fashion, bridging said gap over a considerable portion of its extent; and
    a coupling means situated on said circuit board connected between the input and output coaxial cable inner conductor terminals on said isolator.

7. The coaxial cable isolator of claim 6 wherein said coupling means between said input and output coaxial cable inner conductor terminals comprises a capacitor providing direct current and low frequency isolation.

8. The coaxial cable isolator of claim 6 wherein said coupling means between said input and output coaxial cable inner conductor terminals comprises a microstrip transmission line, situated over ground plane on the opposite planar surface of said circuit board.

9. The coaxial cable isolator of claim 6 further comprising means for the dissipation of static charges accumulated on said input and output coaxial cables internal capacitive elements.

10. The coaxial cable isolator of claim 6 further comprising means for high voltage transient suppression for the protection of equipment connected to said output coaxial cable.

11. The coaxial cable isolator of claim 6 further comprising a conductive enclosure electrically connected to one of said input or output coaxial cable shield conductors and electrically isolated from the other.

12. The coaxial cable isolator of claim 8 wherein said microstrip transmission line further comprises a capacitor providing direct current and audio frequency isolation.

13. The coaxial cable isolator of claim 12 further comprising:
   means for the dissipation of static charges accumulated on said input and output coaxial cables and internal capacitive elements; and
   means for high voltage transient suppression, for the protection of equipment connected to the output of said isolator.

14. The coaxial cable isolator of claim 13 further comprising a conductive enclosure electrically connected to one of said input or output coaxial shield conductor terminals and electrically isolated from the other.

* * * * *